United States Patent [19]

Ida

[11] 4,224,691
[45] Sep. 23, 1980

[54] TUNING INDICATOR SYSTEM FOR FM RADIO RECEIVER

[75] Inventor: Masaru Ida, Hamamatsu, Japan

[73] Assignee: Nippon Gakki Seizo Kabushiki Kaisha, Hamamatsu, Japan

[21] Appl. No.: 33,171

[22] Filed: Apr. 25, 1979

[30] Foreign Application Priority Data

May 4, 1978 [JP] Japan .............................. 53-60673[U]

[51] Int. Cl.² ........................... H04B 1/16; H03J 3/14
[52] U.S. Cl. ........................................ 455/159; 334/36
[58] Field of Search ............... 325/398, 344, 364, 363, 325/455; 334/36, 37

[56] References Cited

U.S. PATENT DOCUMENTS

| | | | |
|---|---|---|---|
| 3,571,714 | 3/1971 | Traub | 325/455 |
| 3,882,399 | 5/1975 | Karpowycz et al. | 325/455 |
| 3,896,386 | 7/1975 | Ohsawa | 325/398 |

*Primary Examiner*—Marc E. Bookbinder
*Attorney, Agent, or Firm*—Cushman, Darby & Cushman

[57] ABSTRACT

A tuning indicator system for making visual tuning indication of an FM radio receiver, in which a dc-voltage component and a detuning-noise component of the output of an FM demodulator in the receiver are detected and then subjected to level comparison for determining the tuning condition of the receiver. When the dc-voltage level is above a positive reference level, a first light-emitting diode (LED) is energized to emit an indication light signal. At the dc-voltage level below a negative reference level, a second LED lights up for indication signal. When the detuning-noise level is below a reference level, a third LED is caused to emit an indication light signal provided that the first and second LED's are de-energized.

13 Claims, 3 Drawing Figures

TUNING INDICATOR SYSTEM FOR FM RADIO RECEIVER

BACKGROUND OF THE INVENTION

1. Field of the Invention

The present invention is related to a tuning indicator system for an FM radio receiver.

2. Description of the Prior Art

In FM radio receiver, unless this receiver is tuned exactly to a given station signal frequency, serious distortion and poor channel separation would result. Therefore, most of known FM radio receivers incorporate some form of visual tuning indicator system as an aid for correct tuning, to avoid the above-said inconveniences.

Conventional tuning indicator systems employed in general may be roughly classified into the following three types: signal meter type, center-tuning meter (S-meter) type, and their combined type.

The signal meter type is such that an indicator meter is driven to indicate the level of carrier signal taken at the IF (Intermediate Frequency) amplifier stage of the receiver. When the receiver is tuned correctly to a station signal, the carrier signal attains a peak level, and then a peak deflection is observed on the indicator meter. With this type of tuning indicator system, however, there often arises the accompaniment of the inconvenience that, in case a station signal is received at a high field strength, the peak point of the carrier signal level and accordingly the peak of the meter deflection could become indistinct due to the signal-limiting action by a limiter in the IF stage, which would obstruct sharp tuning.

The center-tuning meter type system, on the other hand, is arranged so that an indicator meter is driven in accordance with the dc-voltage level of the output of the FM demodulator in the receiver. However, there is the inconvenience that the meter will indicate null point, i.e. the center point in both accurate tuning-in and complete detuning conditions of the receiver, giving rise to confusion.

The combination of the above-mentioned two types of system may be considered to obviate such disadvantages as those that have been stated above from using them separately. However, it may, in turn, give rise to a new problem, which is troublesome tuning operation due to the necessity to simultaneously observe two different types of meters for tuning indication; one meter indicating the carrier signal level of the IF stage, and the other meter indicating the dc-voltage level of the FM-demodulator output.

SUMMARY OF THE INVENTION

It is, therefore, an object of the present invention to provide an improved visual tuning indicator system for an FM radio receiver, which is capable of giving out a clearer indication and of ensuring easy and sharp tuning operation of the receiver.

Another object of the present invention is to provide a tuning indicator system of the type described above, which allows apparent distinction between correct tuning and complete detuning of the receiver.

Yet another object of the present invention is to provide a tuning indicator system of the type described above, which is capable of showing the adjustment direction of the tuning control of the receiver required to tune the receiver for an aimed station.

According to the present invention, there is provided a tuning indicator system for an FM radio receiver, which comprises: a first, a second and a third light-emitting means for visual tuning indication of the receiver; and circuit means operative in association with the output of an FM-demodulator included in the receiver for driving the light-emitting means; the circuit means including means for detecting the level of dc-voltage component of the output of the FM-demodulator to thereby energize the first light-emitting means to emit a signal light when the dc-voltage component level is above a predetermined positive reference level, means for detecting the dc-voltage component level to energize the second light-emitting means to radiate a signal light when the dc-voltage component level is below a predtermined negative reference level, and means for detecting the level of detuning noise component in the FM-demodulator output to energize said third light-emitting means to emit a signal light when said detuning-noise component level is below a predetermined reference level provided that the first and second light-emitting means are de-energized.

These and other object as well as the features and the advantages of the present invention will be apparent from the following detailed description of the preferred embodiments of the present invention when taken in conjunction with the accompanying drawings.

DETAILED DESCRIPTION OF THE PREFERRED EMBODIMENT

Figure 1:
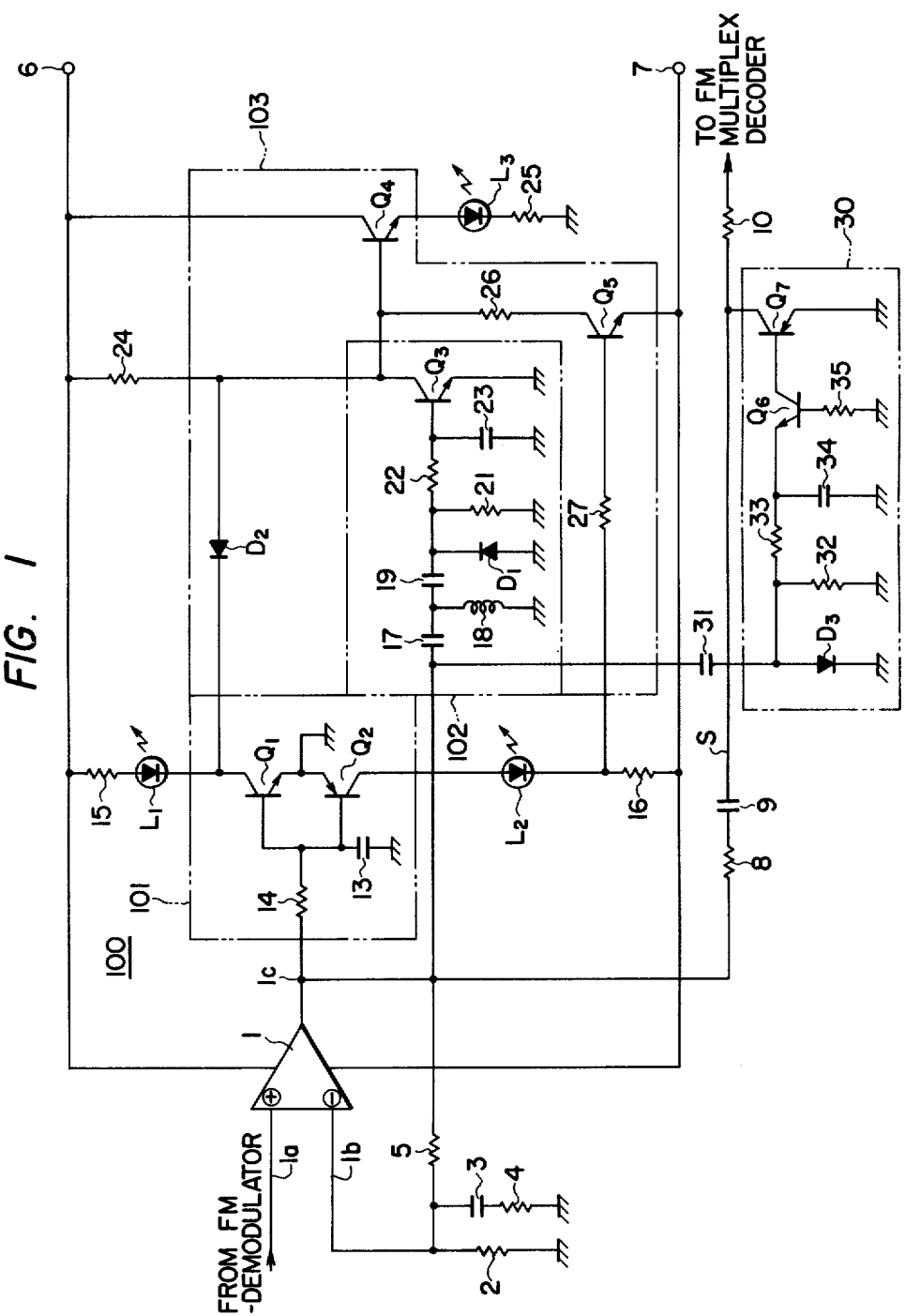
FIG. 1 is a circuit diagram of an embodiment of a tuning indicator system for an FM radio receiver according to the present invention.

An embodiment of a tuning indicator system according to the present invention is shown in FIG. 1, which comprises an indicator circuit indicated generally at 100, and three light-emitting diodes $L_1$, $L_2$ and $L_3$ as light-emitting means for giving visual tuning indication.

The indicator circuit 100, which is associated with the output of an FM-demodulator (not shown) in an FM radio receiver, includes an operational amplifier 1 with its non-inverting input terminal 1a being applied with a demodulator output. The output terminal 1c of the amplifier 1 is fed back to its inverting input terminal 1b via a circuit network composed of resistors 2, 4 and 5, and a capacitor 3. The amplifier 1 is powered by operating voltage supplied from positive and negative voltage supply terminals 6 and 7. The indicator circuit further includes a dc-voltage detector circuit 101 associated with the output of the amplifier 1, a detuning-noise detector circuit 102 operative in association with an output of the amplifier 1, and a tuning-center detector circuit 103 associated with both circuits 101 and 102.

The dc-voltage detector circuit 101 is comprised of a low-pass filter network formed with a resistor 14 and a capacitor 13, which develops, across the capacitor 13, a dc-voltage related to dc-voltage component of the output of the FM-demodulator, and a pair of transistors $Q_1$ and $Q_2$. The transistors $Q_1$ and $Q_2$ are connected together at the emitter to the circuit ground, and mutually coupled, at their bases, to the output terminal 1c of the amplifier 1 via the low-pass filter network. The light-emitting diodes $L_1$ and $L_2$ are connected in series with resistors 15 and 16 in the collector circuits of the transistors $Q_1$ and $Q_2$, respectively. When the dc-voltage across the capacitor 13 exceeds a predetermined positive reference level, the transistor $Q_1$, which is of an npn type, turns on, energizing the light-emitting diode $L_1$ to light up. Conversely, in case a dc-voltage below a predetermined negative reference level is applied to the base of the transistor $Q_2$ of a pnp type, it will turn on and will cause the light-emitting diode $L_2$ to emit light.

The detuning-noise detector circuit 102 includes a high-pass filter network formed with a capacitor 17 and an inductor 18 for passing only the detuning-noise component of the demodulator output supplied through the amplifier 1, and a smoothed rectifier circuit composed of a rectifying diode $D_1$, resistors 21 and 22 and a smoothing capacitor 23 for rectifying and then smoothing the detuning-noise component through the high-pass filter network to produce a dc-voltage across the capacitor 23 which is related to the detuning-noise component level. The circuit 102 further includes an npn-type transistor $Q_3$ as a switching device which has an emitter grounded, a collector connected to the positive voltage supply terminal 6 via a resistor 24, and a base coupled to the output of the smoothed rectifier circuit.

The tuning-center detector circuit 103 is designed so as to operate in association with the outputs of both the dc-voltage detector circuit 101 and the detuning-noise detector circuit 102. It includes npn-type transistors $Q_4$ and $Q_5$, and a diode $D_2$ as a switching device. The base of the transistor $Q_4$ is connected directly to the collector of the transistor $Q_3$, and via a resistor 26, to the collector of the transistor $Q_5$. The collector of the transistor $Q_4$ is connected to the positive voltage supply terminal 6, the emitter being grounded via the light-emitting diode $L_3$ and a resistor 25. The transistor $Q_5$ is connected, at its emitter to the negative voltage supply terminal 7, and at its base to the cathode of the light-emitting diode $L_2$ through a resistor 27. The switching diode $D_2$ is connected in parallel between the collector of the transistor $Q_1$ and the collector of the transistor $Q_3$.

In FIG. 1, a muting circuit 30 is also shown which operates on the basis of the output of the amplifier 1 to perform muting action onto a signal path S leading from the FM-demodulator output through the amplifier 1 to an FM multiplex decoder (not shown) in the receiver. This muting circuit 30 is comprised of a smoothed rectifier circuit constructed with a rectifying diode $D_3$, resistors 32 and 33, and a capacitor 34, and transistors $Q_6$ and $Q_7$. The transistor $Q_6$ has its emitter coupled to the smoothed rectifier circuit output, the base grounded via a resistor 35, and its collector connected to the base of the transistor $Q_7$ for shunting the signal path S. The above-mentioned signal path S includes a series connection of resistors 8 and 10, and a capacitor 9.

Figure 2:
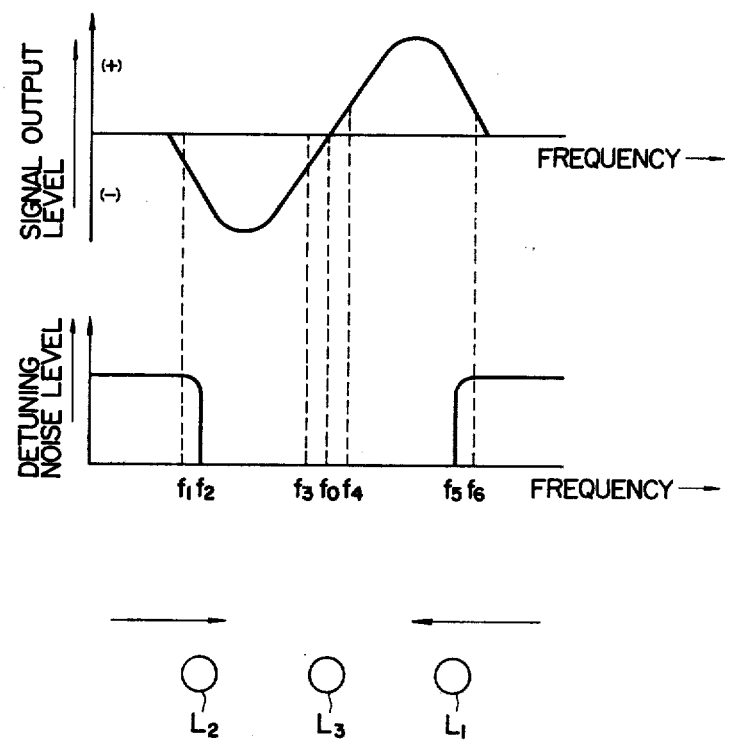
FIG. 2 is a schematic chart for explaining the operation of a tuning indicator system of the present invention, in which typical signal output response and detuning-noise generation characteristic of an FM-demodulator in an FM radio receiver, as will as arrangement of light-emitting means included in the system are diagrammatically illustrated.

Description will hereunder be made of the operation of the present embodiment by referring to FIG. 2, in which a typical signal output response curve (S-curve) and a typical detuning-noise generation characteristic curve of the FM-demodulator are schematically shown, and also in which the light-emitting diodes $L_1$, $L_2$ and $L_3$ are illustrated as being associated with those curves.

When the receiver is tuned accurately to a station signal frequency, namely when the receiver is exactly tuned in to the station signal on the center of carrier frequency, the frequency of the demodulator input signal which is the station signal subjected to frequency conversion by the converter stage (not shown) in the receiver is within a frequency range from $f_3$ to $f_4$ whose center frequency is $f_0$ (see FIG. 2). At such time, the dc-voltage level of the demodulator output is almost zero. Hence, only a very small voltage is developed across the filter capacitor 13 in the dc-voltage detector circuit 101. Accordingly, neither the transistor $Q_1$ nor the transistor $Q_2$ is turned on, so that none of the light-emitting diodes $L_1$ and $L_2$ is energized. In such exactly tuned condition, the demodulator output contains substantially no detuning-noise component as can be seen in FIG. 2, and therefore the base of the transistor $Q_3$ in the circuit 102 is maintained at substantially the ground potential. Hence, the transistor $Q_3$ is in the non-conductive state. Also, the diode $D_2$ and the transistor $Q_5$ are turned off. As a result, the base of the transistor $Q_4$ in the tuning-center detector circuit 103 attains a positive potential enough to turn it on, with the result that the light-emitting diode $L_3$ is energized to emit light.

Next, suppose that the tuning frequency of the receiver is at a frequency which is slightly higher (or lower) than a station signal frequency so that the demodulator input signal is contained with in the frequency range from $f_4$ to $f_6$ (or from $f_1$ to $f_3$). Under such slightly detuned condition, the dc-voltage component level of the demodulator output will increase positively (or negatively), and therefore the potentials at the bases of the transistors $Q_1$ and $Q_2$ will become above the positive reference level (or below the negative reference level). Thus, the transistor $Q_1$ (or $Q_2$) will be turned on, energizing the light-emitting diode $L_1$ (or $L_2$) to radiate light. The transistor $Q_3$ of the circuit 102, on the other hand, is in the turned-off state because of the low level of the detuning-noise component of the demodulator output. However, the base of the transistor $Q_4$ is reverse-biased through the conducting diode $D_2$ (or conducting transistor $Q_5$), so that transistor $Q_4$ is mentained in its non-conductive state, de-energizing the light-emitting diode $L_3$.

When the receiver is completely detuned and when the demodulator input signal is at a frequency higher than $f_6$ or lower than $f_1$, the dc-voltage level of the demodulator output and the related potential at the bases of the transistors $Q_1$ and $Q_2$ will be very low or nil. At such instance, the transistors $Q_1$ and $Q_2$ are both in the turned-off state, so that the light-emitting diodes are de-energized. On the other hand, the demodulator output contains a high level of detuning-noise component, and its rectified and smoothed voltage across the capacitor 23 attains such positive as is enough to render the transistor $Q_3$ conductive. Therefore, the transistor $Q_4$ is held in its turned-off state, de-energizing the light-emitting diode $L_3$.

In short, the lighting-up of the light-emitting diode $L_3$ indicates a correct tuning-in of the receiver for a given station; the lighting-up of the light-emitting diode $L_2$ indicates the fact that the receiver is slightly detuned and warns that a tuning control dial (not shown) of the receiver should be slightly re-adjusted toward the higher frequency side; the illumination of the light-emitting diode $L_1$ is indicative of the fact that the receiver is slightly detuned and warns that the tuning control dial should be set slightly toward the lower frequency side; and the extinguishment of all light-emitting diodes means complete detuning of the receiver.

It will be noted that, when the frequency of the demodulator input is below $f_2$ or above $f_5$, a high-level detuning-noise component of the demodulator output generates a negative voltage across the capacitor 34, turning the transistor $Q_6$ on. Thus, the transistor $Q_7$ is turned on, grounding the signal path S to effect muting function.

Figure 3:
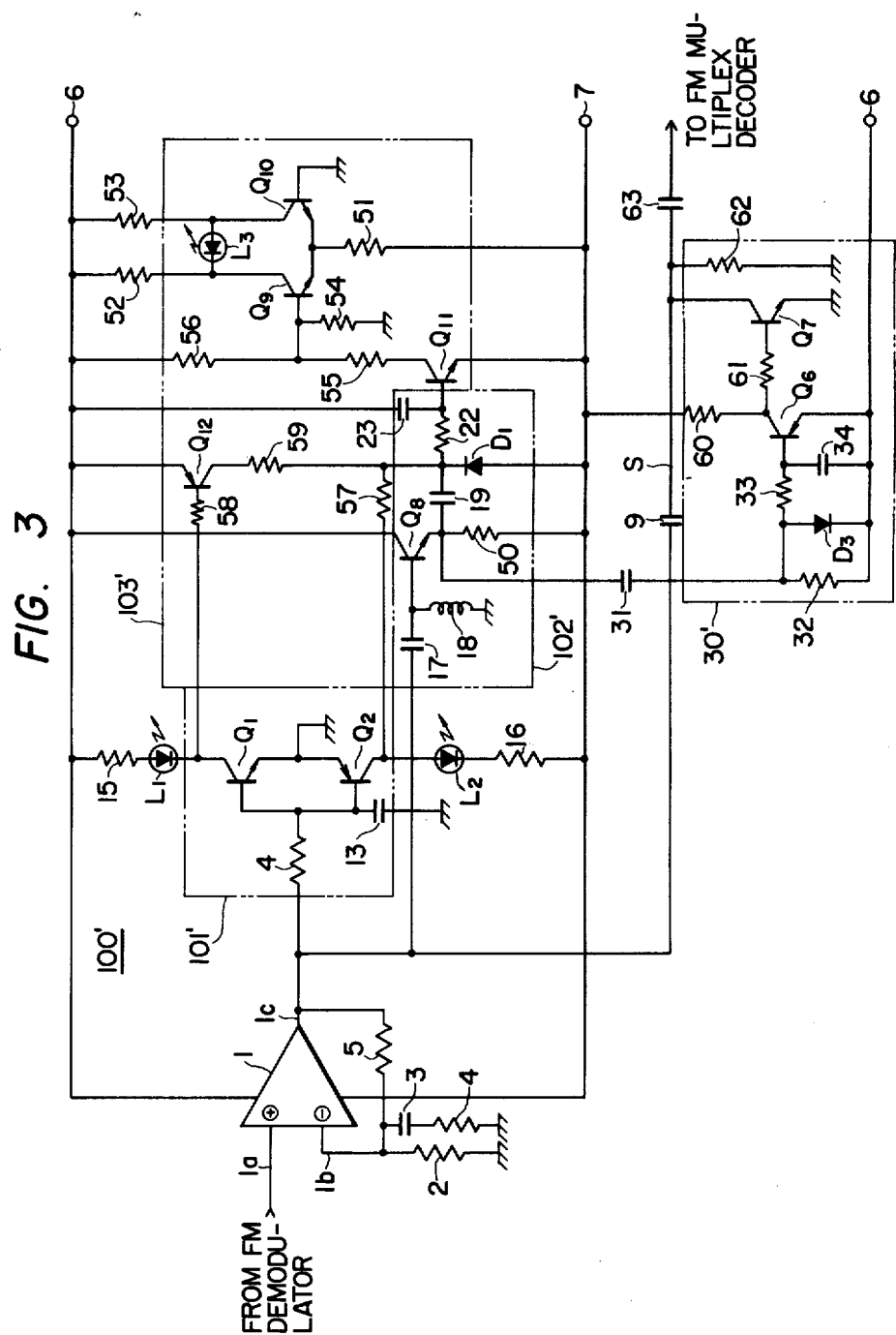
FIG. 3 is a circuit diagram of another embodiment of a tuning indicator system of the present invention.

Another embodiment of a tuning indicator system of the present invention is indicated generally at 100' in FIG. 3, which differs from the previous embodiment in the arrangement of the detuning-noise detector circuit, tuning-center detector circuit, the muting circuit and the signal path to the FM multiplex decoder.

This instant detuning-noise detector circuit, indicated generally at 102', comprises a high-pass filter network of a capacitor 17 and an inductor 18, a smoothed rectifier circuit composed of a rectifying diode $D_1$, a resistor 22 and a smoothing capacitor 23, and an emitter-follower circuit of a transistor $Q_8$ and a resistor 50 for buffering between those two circuits. The output of the high-pass filter network is coupled to the base of the transistor $Q_8$, and the input of the smoothed rectifier circuit is coupled, via a capacitor 19, to the emitter of the buffering transistor $Q_8$.

The tuning-center detector circuit, indicated generally at 103', includes a differential amplifier circuit formed with a pair of npn-type transistors $Q_9$ and $Q_{10}$ which are coupled together at their emitters and are connected to the negative voltage supply terminal 7 via a resistor 51, and are further connected respectively at their collectors to the positive voltage supply terminal 6 via resistors 52 and 53. The light-emitting diode $L_3$ for tuning-center indication is connected between the collectors of the coupled transistors $Q_9$ and $Q_{10}$. The base of the transistor $Q_{10}$ is grounded, while the base of the other transistor $Q_9$ is grounded via a resistor 54 and is coupled to the collector of an npn-type transistor $Q_{11}$ via a resistor 55. The emitter of the transistor $Q_{11}$ is connected to the negative voltage supply terminal 7, the collector thereof being connected to the positive voltage supply terminal 6 via resistors 55 and 56. The base of this transistor $Q_{11}$ is coupled to the output of the smoothed rectifier circuit of the circuit 102'. The tuning-center detector circuit 103' further includes a circuit for inhibiting the outputting of the detuning-noise detector circuit 102' when either one of transistors $Q_1$ and $Q_2$ is in the conductive state. This inhibiting circuit is composed of a resistor 57 connected between the collector of the transistor $Q_2$ and the cathode of the rectifying diode $D_1$, and a transistor $Q_{12}$ whose base is connected to the collector of the transistor $Q_1$ via a resistor 58 and whose emitter and collector are connected directly to the positive voltage supply terminal 6, and via a resistor 59, to the cathode of the rectifying diode $D_1$, respectively.

The muting circuit, indicated generally at 30', is modified in that the transistor $Q_6$ followed by the muting transistor $Q_7$ is of the collector-grounded configuration and that an additional resistor 62 is connected in parallel across the transistor $Q_7$. The emitter of the transistor $Q_6$ is connected to the positive voltage supply terminal 6 and the collector is connected to the negative voltage supply terminal 7 via a resistor 60. The base of the transistor $Q_7$ is coupled to the collector of the preceding transistor $Q_6$ via a resistor 61. Furthermore, the muting circuit is arranged to receive only the detuning-noise component of the demodulator output through the high-pass filter network and through the buffering transistor $Q_8$ in the detuning-noise detector circuit 102'.

The operation is as follows:

At the exactly tuned condition of the receiver for a given station signal, the transistors $Q_1$ and $Q_2$ are both in their non-conductive state, with the result that the light-emitting diodes $L_1$ and $L_2$ are de-energized. Also, the detuning-noise level of the demodulator output is very low, so that the output of the detuning-noise detector circuit 102' will hold the transistor $Q_{11}$ in its turned-off state. Thus, the transistor $Q_9$ is forwardly-biased, the collector potential thereof being lowered. As a result, the light-emitting diode $L_3$ is energized to radiate a signal light for the indication that the receiver is exactly tuned in.

If the receiver is slightly detuned from a given station toward the higher (or lower) frequency side, the transistor $Q_1$ (or $Q_2$) will become turned on, causing the light-emitting diode $L_1$ (or $L_2$) to light up. At the same time therewith, the output of the detuning-noise detector circuit 102' is inhibited through the transistor $Q_{12}$ (or the resistor 57), and is held at such potential as will turn the transistor $Q_{11}$ on. Therefore, the transistor $Q_9$ becomes reversely-biased, and accordingly the light-emitting diode $L_3$ becomes de-energized.

When the receiver is completely detuned, both transistors $Q_1$ and $Q_2$ will be in their non-conductive state, so that none of the light-emitting diodes $L_1$ and $L_2$ will be energized. On the other hand, the output of the detuning-noise detector circuit 102' will attain a level great enough to forwardly-biase the transistor $Q_{11}$ to be conductive. Therefore, the transistor $Q_9$ will become reversely-biased through the conductive transistor $Q_{11}$, so that the light-emitting diode $L_3$ will not become energized. The operation of the muting circuit 30' is analogous to that of the preceding circuit embodiment, and therefore its further description is omitted.

What is claimed is:

1. A tuning indicator system for an FM radio receiver, comprising:
  a first, a second and a third light-emitting means for visual indication of tuning conditions of said receiver; and
  a tuning indicator circuit operative in association with an output of an FM demodulator included in said receiver for driving said first, second and third light-emitting means,
  said tuning indicator circuit including circuit means for detecting the level of the dc-voltage component of said demodulator output and circuit means for detecting the level of detuning noise component of said demodulator output, whereby said first light-emitting means becomes energized to emit light by said tuning indicator circuit when said dc-voltage component level is above a predetermined positive reference level, and said second light-emitting means becomes energized to radiate light by said tuning indicator circuit when said dc-voltage component level is below a predetermined negative reference level, and said third light-emitting means becomes energized to emit light by said tuning indicator circuit when said detuning-noise component level is below a predetermined reference level provided that said first and second light-emitting means are de-energized.

2. A tuning indicator system according to claim 1, in which: said respective light-emitting means comprise light-emitting diodes.

3. A tuning indicator system according to claim 1, in which: said circuit means for detecting the dc-voltage component level includes a low-pass filter network receiving said demodulator output to produce a dc-voltage signal related to said dc-voltage component of said demodulator output, and includes a first switching means driven by said dc-voltage signal delivered from said low-pass filter network to energize said first light-emitting means when said dc-voltage component level of said demodulator output is above said positive reference level, and further includes a second switching means driven by said dc-voltage signal delivered from said low-pass filter network to energize said second light-emitting means when said dc-voltage component level of said demodulator output is below said negative reference level.

4. A tuning indicator system according to claim 1, in which: said circuit means for detecting the detuning-noise component level includes: a high-pass filter network receiving said demodulator output to pass said detuning-noise component only; and a smoothed rectifier circuit for rectifying and smoothing said detuning-noise component supplied through said high-pass filter network to produce a dc-voltage signal related with said detuning-noise component, and in which: said third light-emitting means is driven in assoication with said dc-voltage signal produced by said smoothed rectifier circuit.

5. A tuning indicator system according to claim 1, in which: said tuning indicator circuit includes circuit means for energizing said third light-emitting means in association with said first-mentioned two circuit means.

6. A tuning indicator system according to claim 5, in which: said circuit means for energizing said third light-emitting means includes a third switching means driven in accordance with the output of said detuning-noise component level detecting circuit means to energize said third light-emitting means, and circuit means associated with said dc-voltage component level detecting circuit means for preventing said third switching means from energizing said third light-emitting means when either one of said first and second light-emitting means is energized.

7. A tuning indicator system for an FM radio receiver, comprising:
 a first, a second and a third light-emitting device;
 a first circuit including a first switching device switched in association with an output of an FM demodulator included in said receiver and connected in series in a current path for energizing said first light-emitting device, and a second switching device switched in association with the demodulator output and connected in series in a current path for energizing said second light-emitting device, said first switching device turning said first light-emitting device on and causing it to emit light when said demodulator output attains a dc-voltage level higher than a predetermined positive reference level, said second switching device turning said second light-emitting device on and causing it to emit light when said demodulator output attains a dc-voltage lower than a predetermined negative reference level;
 a second circuit including a third switching device switched in association with said demodulator output, said third switching device being turned on when said demodulator output contains detuning-noise component of a level higher than a reference noise level; and
 a third circuit including a fourth switching device driven in association with said first, second and third switching device and connected to a current path for energizing said third light-emitting device, said fourth switching device being turned on to cause said third light-emitting device to emit light when all of said first, second and third switching devices are turned off.

8. A tuning indicator system according to claim 7, in which: said first switching device comprises an npn-type transistor having an emitter grounded, a collector connected via said first light-emitting device to a positive voltage supply terminal, and a base supplied with said demodulator output through a low-pass filter network; and said second switching device comprises a pnp-type transistor having an emitter grounded, a collector connected via said second light-emitting device to a negative voltage supply terminal, and a base supplied with said demodulator output through said low-pass filter network.

9. A tuning indicator system according to claim 8, in which: said fourth switching device comprises an npn-type transistor having a collector connected to said positive voltage supply terminal, an emitter grounded via said third light-emitting device, and a base connected to said third switching device and further connected to the collector of said first switching device via a diode, and in which: said third circuit further includes an npn-type transistor having an emitter connected to said negative voltage supply terminal, a collector connected to said base of said third switching device, and a base coupled to the collector of said second switching device.

10. A tuning indicator system according to claim 9, in which: said third switching device comprises an npn-type transistor having a base, an emitter grounded, a collector connected to said positive voltage supply terminal via a resistor and to the base of said fourth switching device, and in which: said second circuit further includes a high-pass filter network for passing only the detuning-noise component of said demodulator output, and a smoothed rectifier circuit for rectifying and smoothing said detuning-noise component delivered from said high-pass filter network to thereby produce a dc-voltage related to said detuning-noise component to drive the base of said third switching device.

11. A tuning indicator system according to claim 8, in which: said fourth switching device comprises an npn-type transistor having a base connected to said third switching device, a collector connected to said positive voltage supply terminal via a resistor, an emitter connected to said negative voltage supply terminal via a resistor, and in which: said third circuit further includes another npn-type transistor having a base grounded, an emitter connected to the emitter of said fourth switching device, and a collector connected to said positive voltage supply terminal via a resistor, said third light-emitting device being connected between the collector of said fourth switching device and the collector of said another transistor.

12. A tuning indicator system according to claim 11, in which: said third switching device comprises an npn-type transistor having an emitter connected to said negative voltage supply terminal, a collector connected to said positive voltage supply terminal via a resistor, and a base, the base of said fourth switching device being coupled to the collector of said third switching device, and in which: said second circuit further includes: a high-pass filter network for passing only the detuning-noise component of said demodulator output; a smoothed rectifier circuit for rectifying and smoothing the detuning-noise component delivered from said high-pass filter network to thereby produce a dc-voltage related with said detuning-noise component, by which dc-voltage is driven the base of said third switching device; a resistor coupling the collector of said second switching device and the base of said third switching device; and still another pnp-type transistor having a base connected to the collector of said first switching device, an emitter connected to said positive voltage supply terminal, and a collector coupled to the base of said third switching device.

13. A tuning indicator system according to claim 12, in which: said second circuit further includes a further npn-type transistor forming an emitter-follower circuit through which the detuning-noise component delivered from said high-pass filter network is applied to said smoothed rectifier circuit.

* * * * *